(12) United States Patent
Li et al.

(10) Patent No.: US 10,126,343 B2
(45) Date of Patent: Nov. 13, 2018

(54) ESD DETECTION METHOD FOR ARRAY SUBSTRATE

(71) Applicant: Wuhan China Star Optoelectronics Technology Co., Ltd., Wuhan (CN)

(72) Inventors: Yafeng Li, Wuhan (CN); Xiangyi Peng, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 316 days.

(21) Appl. No.: 14/912,924

(22) PCT Filed: Jan. 29, 2016

(86) PCT No.: PCT/CN2016/072776
§ 371 (c)(1),
(2) Date: Feb. 19, 2016

(87) PCT Pub. No.: WO2017/101205
PCT Pub. Date: Jun. 22, 2017

(65) Prior Publication Data
US 2018/0031623 A1  Feb. 1, 2018

(30) Foreign Application Priority Data
Dec. 16, 2015  (CN) .......................... 2015 1 0943309

(51) Int. Cl.
*G01R 31/00* (2006.01)
*G01R 31/08* (2006.01)
(Continued)

(52) U.S. Cl.
CPC .......... *G01R 31/001* (2013.01); *G01R 31/08* (2013.01); *G02F 1/1368* (2013.01);
(Continued)

(58) Field of Classification Search
None
See application file for complete search history.

(56) References Cited

U.S. PATENT DOCUMENTS

| 8,018,543 | B2 * | 9/2011 | Huang | ................ G02F 1/13452 349/153 |
| 2003/0080748 | A1 * | 5/2003 | Newman | ................ G01N 27/07 324/458 |

(Continued)

*Primary Examiner* — Melissa Koval
*Assistant Examiner* — Nasima Monsur
(74) *Attorney, Agent, or Firm* — Leong C. Lei (57) ABSTRACT

The invention provides an ESD detection method for array substrate. By connecting the first metal layer on array substrate through the first wire to the first test point, connecting the second metal layer on array substrate through the second wire to the second test point, when ESD occurs on array substrate, the resistance detection device is used to measure the resistance between the first and second test points. If the resistance is positive infinity, ESD did not occur between the first and second metal layers; if the resistance is within a measurable range, ESD occurs between the first and second metal layers. The resistance is used to locate the location of ESD occurrence on array substrate. Compared to known method using microscope to search ESD location, the invention can locate ESD location on array substrate more accurately and rapidly to save time and labor as well as detection cost.

17 Claims, 8 Drawing Sheets providing an array substrate for ESD detection, the array substrate disposed with a first metal layer and a second metal layer; the first metal layer connected to a first test point on the array substrate through a first wire, and the second metal layer connected to a second test point on the array substrate through a second wire ─1 providing a resistance detection device, using the resistance detection device to test a resistance between the first test point and the second test point; based on the resistance, locating the location of the ESD occurrence. ─2

(51) Int. Cl.
    *G02F 1/1362*     (2006.01)
    *G02F 1/1368*     (2006.01)
    *G09G 3/00*     (2006.01)
    *G02F 1/1333*     (2006.01)
    *G09G 3/36*     (2006.01)

(52) U.S. Cl.
    CPC ....... *G02F 1/136286* (2013.01); *G09G 3/006* (2013.01); *G02F 1/133345* (2013.01); *G02F 1/136204* (2013.01); *G02F 2001/136254* (2013.01); *G02F 2001/136295* (2013.01); *G02F 2202/104* (2013.01); *G09G 3/3648* (2013.01); *G09G 2300/0417* (2013.01)

(56) References Cited

U.S. PATENT DOCUMENTS

2007/0090410 A1*   4/2007   Chen ................... H01L 27/0251
                                                                              257/223
2007/0279036 A1*  12/2007   Enta ..................... G01R 31/001
                                                                                324/66
2008/0108217 A1*   5/2008   Mitra .................... H01L 23/62
                                                                              438/605

* cited by examiner

ESD DETECTION METHOD FOR ARRAY SUBSTRATE

BACKGROUND OF THE INVENTION

1. Field of the Invention

The present invention relates to the field of display, and in particular to a electro-static discharge (ESD) detection method for array substrate.

2. The Related Arts

The liquid crystal display (LCD) provides the advantages of thin, low power consumption, radiation-free, and so on, and is widely applied to, such as, mobile phones, personal digital assistant (PDA), digital camera, computer monitors and notebook computers.

The conventional liquid crystal display devices on the market are mostly of the backlight type, comprising a case, a liquid crystal panel and a backlight module disposed inside the case. The traditional structure of the liquid crystal panel comprises a color filter (CF) substrate, a TFT array substrate, and a liquid crystal layer sandwiched between two substrates. The working principle is to apply a driving voltage to the two glass substrates to control the rotation of the liquid crystal molecules of the liquid crystal layer to refract the light from backlight to display.

LTPS technology is a new generation TFT substrate manufacturing technology, and the major difference between the conventional amorphous silicon (a-Si) technology and LTPS technology is that the LTPS provides that advantages of high response speed, high brightness, high-resolution and low power consumption.

As the LTPS TFT technology progresses, and due to the ultra-high carrier migration rate of LTPS semiconductor, the corresponding peripheral circuits on the panel also attract attention from industry. Much research is conducted on the system on panel (SOP) technology, which gradually becomes a reality. Because the LTPS manufacturing is more complex and requires more processes, the probability of electro-static discharge (ESD) is higher.

ESD is a common process malfunction. When ESD occurs, the ESD-related circuit will melt due to instantaneous high current. After cool down, the originally disconnected metal will be connected to further aggravate the ESD damage. Therefore, ESD detection method is vital and necessary. The current ESD detection is to search the ESD damage under the microscope, which is not only time-consuming, but also costly.

It is desirable to provide an ESD detection method to address the above issue.

SUMMARY OF THE INVENTION

The object of the present invention is to provide an ESD detection method, which is able to accurately detect the locations of ESD occurrence on the array substrate.

To achieve the above object, the present invention provides an ESD detection method, which comprises: Step 1: providing an array substrate for ESD detection, the array substrate being disposed with a first metal layer and a second metal layer; the first metal layer being connected to a first test point on the array substrate through a first wire, and the second metal layer being connected to a second test point on the array substrate through a second wire; Step 2: providing a resistance detection device, using the resistance detection device to test a resistance between the first test point and the second test point; if the resistance between the first test point and the second test point is positive infinity, no ESD occurrence between the first metal layer and the second metal layer; if the resistance between the first test point and the second test point is within a measurable range, an ESD occurrence existing between the first metal layer and the second metal layer; as such, the resistance measured between the first test point and the second test point being used to locate the location of the ESD occurrence on the array substrate.

The first metal layer and the second metal layer are on different layers of the array substrate.

An insulating layer is disposed between the first metal layer and the second metal layer.

The array substrate is a LTPS TFT substrate.

The first metal layer and the second metal layer are one of Mo, Al or Cu or stacked layers of the above.

The insulating layer is made of SiNx, SiOx or a combination of both.

The first wire and the second wire are both metal wires, and the first test point and the second test point are both metal blocks.

The first wire and the second wire are made of Cu or Al.

The first test point and the second test point are made of Cu or Al.

The present invention provides an ESD detection method, which comprises: Step 1: providing an array substrate for ESD detection, the array substrate being disposed with a first metal layer and a second metal layer; the first metal layer being connected to a first test point on the array substrate through a first wire, and the second metal layer being connected to a second test point on the array substrate through a second wire; Step 2: providing a resistance detection device, using the resistance detection device to test a resistance between the first test point and the second test point; if the resistance between the first test point and the second test point is positive infinity, no ESD occurrence between the first metal layer and the second metal layer; if the resistance between the first test point and the second test point is within a measurable range, an ESD occurrence existing between the first metal layer and the second metal layer; as such, the resistance measured between the first test point and the second test point being used to locate the location of the ESD occurrence on the array substrate; wherein the array substrate is a LTPS TFT substrate; wherein the first metal layer and the second metal layer are one of Mo, Al or Cu or stacked layers of the above; wherein the first wire and the second wire are both metal wires, and the first test point and the second test point are both metal blocks.

Compared to the known techniques, the present invention provides the following advantages: the present invention provides an ESD detection method for array substrate. By connecting the first metal layer on the array substrate through the first wire to the first test point, and connecting the second metal layer on the array substrate through the second wire to the second test point, when an ESD occurs on the array substrate, the resistance detection device is used to measure the resistance between the first test point and the second test point. If the resistance is positive infinity, the ESD did not occur between the first metal layer and second metal layer; if the resistance is within a measurable range, an ESD occurs between the first metal layer and the second metal layer. The resistance measured between the first test point and the second test point is used to locate the location of the ESD occurrence on the array substrate. Compared to known method using microscope to search ESD location, the present invention can locate the ESD location on the array substrate more accurately and rapidly to save time and labor as well as detection cost.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
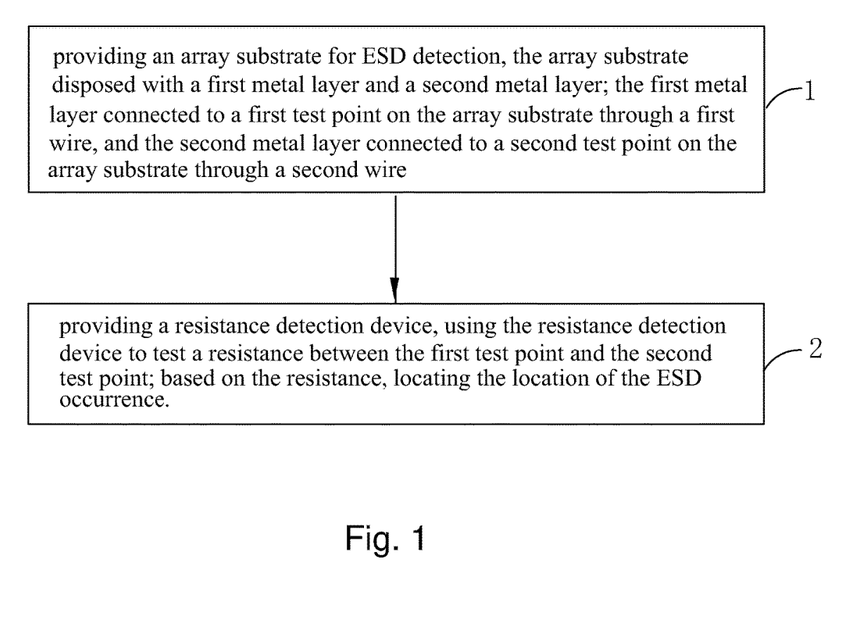
FIG. 1 is a schematic view showing the flowchart of the ESD detection method for array substrate provided by an embodiment of the present invention.
Figure 2:
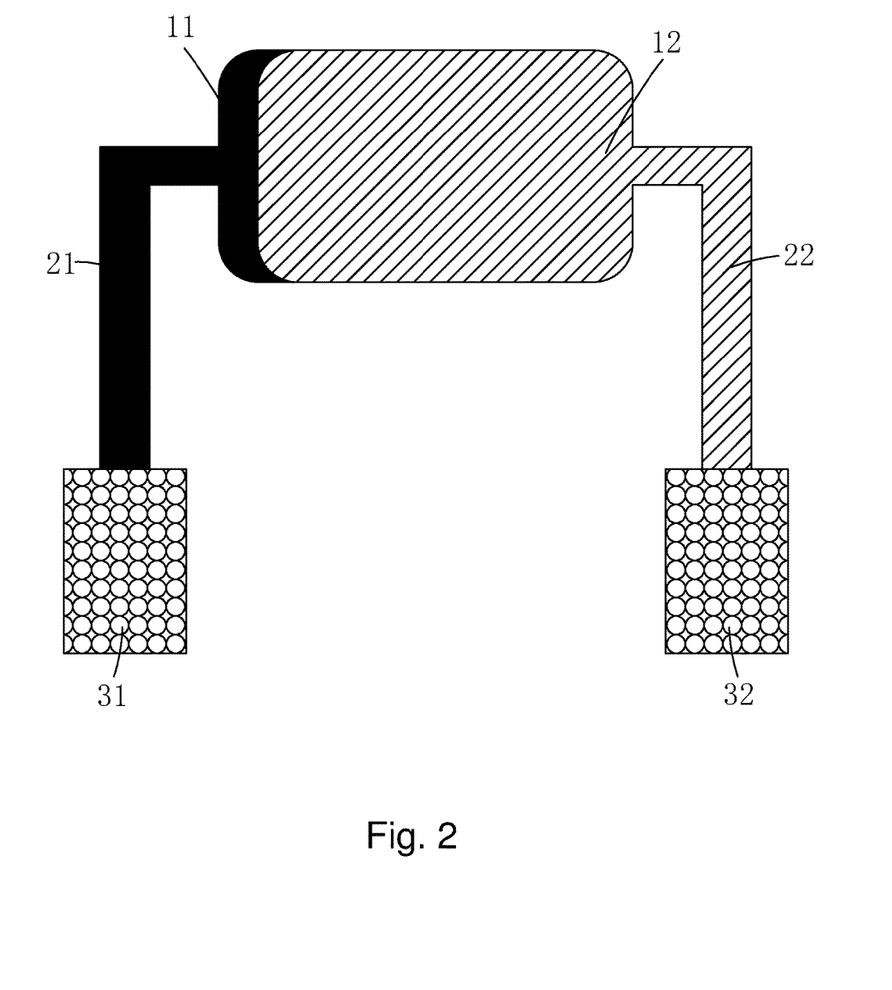
FIG. 2 is a schematic view showing the Step 1 of the first embodiment of the ESD detection method for array substrate provided by an embodiment of the present invention.

Refer to FIG. 1, in combination with FIGS. 2-6. The present invention provides an ESD detection method, which comprises:

Step 1: as shown in FIG. 2, providing an array substrate for ESD detection, the array substrate being disposed with a first metal layer 11 and a second metal layer 12; the first metal layer 11 being connected to a first test point 31 on the array substrate through a first wire 21, and the second metal layer 12 being connected to a second test point 32 on the array substrate through a second wire 22.

Preferably, the first test point 31 and the second test point 32 are both disposed on the surface of the peripheral area of the array substrate.

Specifically, the array substrate is a LTPS TFT substrate.

Specifically, the first metal layer 11 and the second metal layer 12 are on different layers of the array substrate, and both the first metal layer 11 and the second metal layer 12 are of a block structure.

Specifically, the first metal layer 11 and the second metal layer 12 are one of Mo, Al or Cu or stacked layers of the above.

Figure 4:
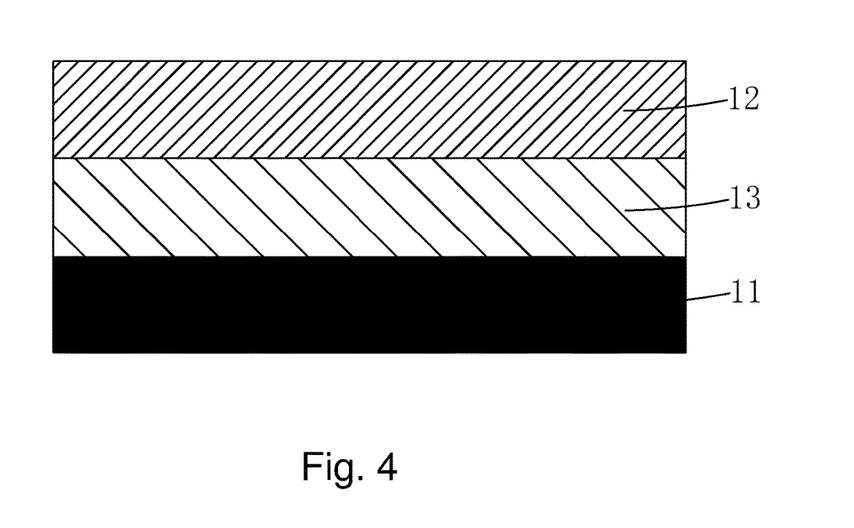
FIG. 4 is a cross-sectional view showing the first metal layer and the second metal layer in FIG. 3.

Specifically, an insulating layer 13 is disposed between the first metal layer 11 and the second metal layer 12.

Specifically, the insulating layer 13 is made of SiNx, SiOx or a combination of both.

Specifically, the first wire 21 and the second wire 22 are both metal wires, and the first test point 31 and the second test point 32 are both metal blocks.

Specifically, the first wire 21 and the second wire 22 are made of Cu or Al.

Specifically, the first test point 31 and the second test point 32 are made of Cu or Al.

Step 2: providing a resistance detection device (not shown), using the resistance detection device to test a resistance between the first test point 31 and the second test point 32.

Figure 3:
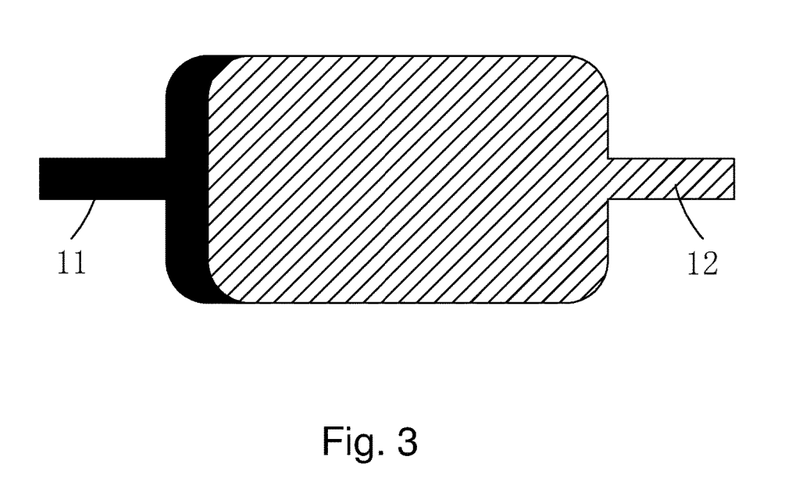
FIG. 3 is a schematic view showing the first metal layer and the second metal layer on the array substrate provided in Step 1 of the first embodiment of the ESD detection method for array substrate operating under a normal condition provided by an embodiment of the present invention.
Figure 5:
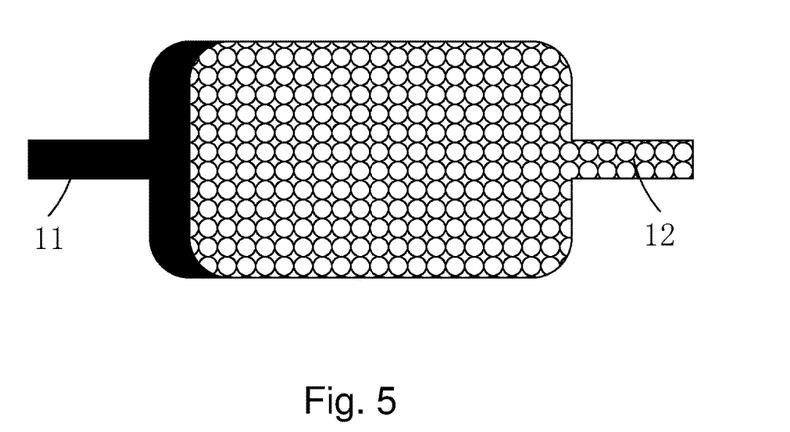
FIG. 5 is a schematic view showing the first metal layer and the second metal layer after ESD in FIG. 3.
Figure 6:
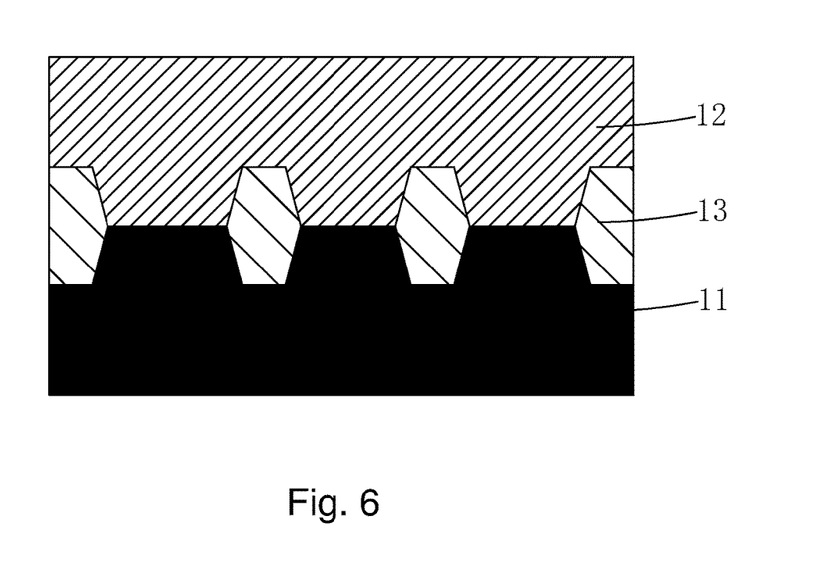
FIG. 6 is a cross-sectional view showing the first metal layer and the second metal layer in FIG. 5.

Refer to FIGS. 3-4. If the resistance between the first test point 31 and the second test point 32 is positive infinity, the first metal layer 11 and the second metal layer 12 are not connected by ESD occurrence. Refer to FIGS. 5-6. If the resistance between the first test point 31 and the second test point 32 is within a measurable range, the first metal layer 11 and the second metal layer 12 are connected due to ESD occurrence, and hence an ESD occurs between the first metal layer 11 and the second metal layer 12. As such, the resistance measured between the first test point 31 and the second test point 32 can be used to locate the location of the ESD occurrence on the array substrate.

Specifically, the resistance detection device is a multimeter or a megger, preferably a multimeter.

Figure 7:
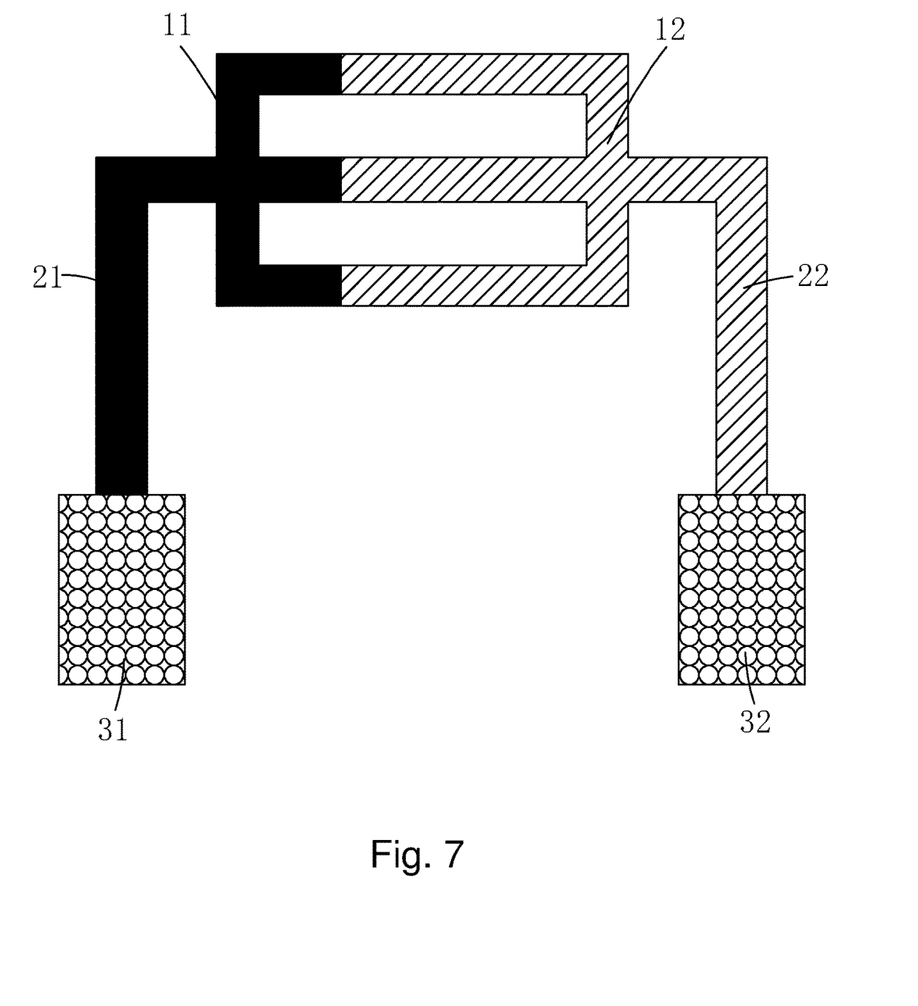
FIG. 7 is a schematic view showing the Step 1 of the second embodiment of the ESD detection method for array substrate provided by an embodiment of the present invention.
Figure 8:
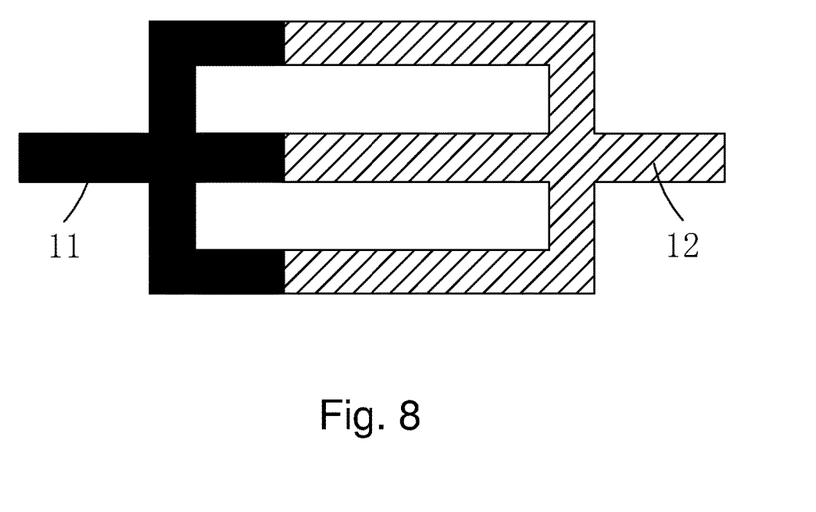
FIG. 8 is a schematic view showing the first metal layer and the second metal layer on the array substrate provided in Step 1 of the second embodiment of the ESD detection method for array substrate operating under a normal condition provided by an embodiment of the present invention.
Figure 9:
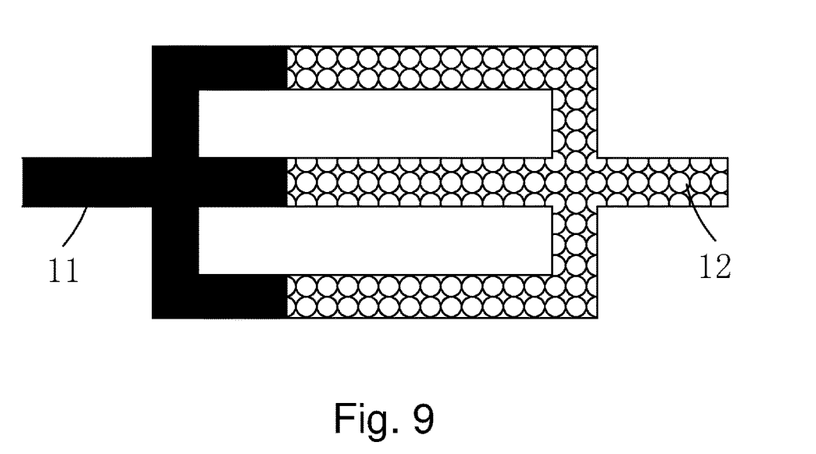
FIG. 9 is a schematic view showing the first metal layer and the second metal layer after ESD in FIG. 8.

Refer to FIGS. 7-9 for the second embodiment of the ESD detection method for array substrate of the present invention. The second embodiment differs from the first embodiment in that: the first metal layer 11 and the second metal layer 12 on the array substrate to be tested are both of a wire stricture, and the remaining is the same as the first embodiment, thus the description will not be repeated.

Figure 10:
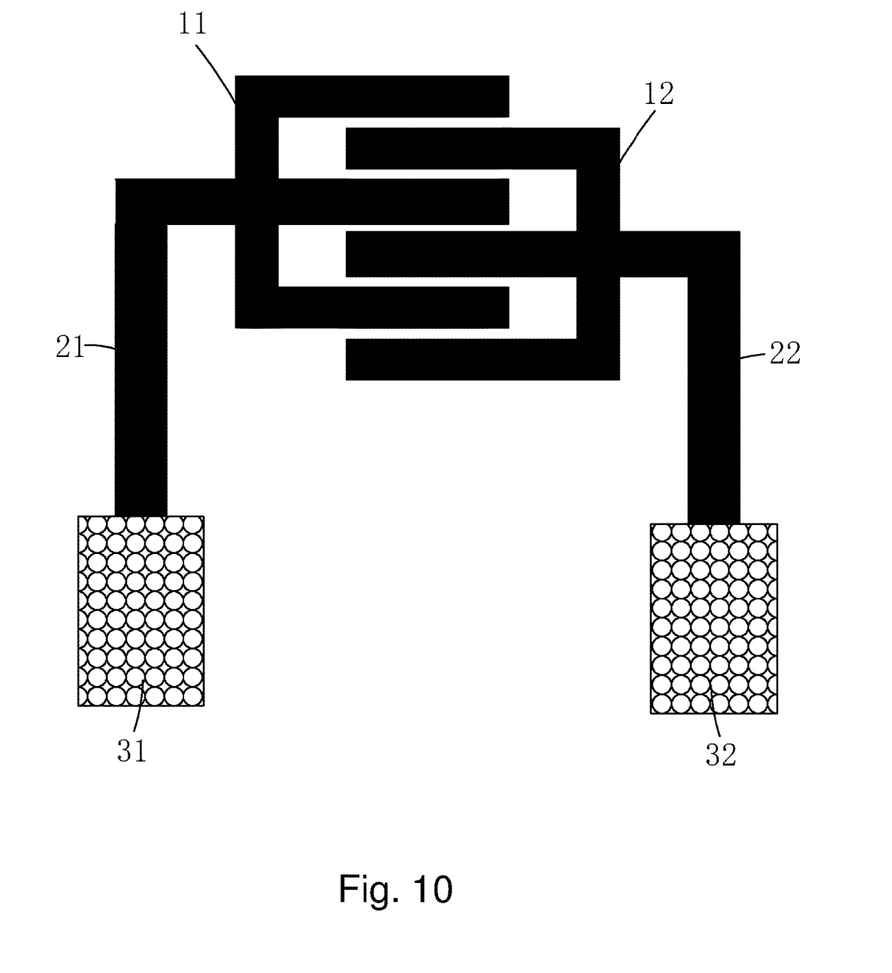
FIG. 10 is a schematic view showing the Step 1 of the third embodiment of the ESD detection method for array substrate provided by an embodiment of the present invention.
Figure 11:
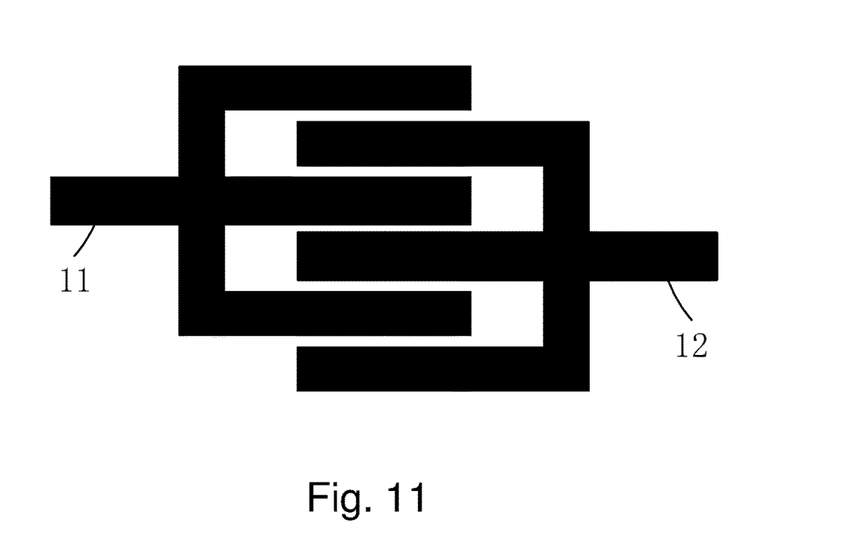
FIG. 11 is a schematic view showing the first metal layer and the second metal layer on the array substrate provided in Step 1 of the third embodiment of the ESD detection method for array substrate operating under a normal condition provided by an embodiment of the present invention.
Figure 12:
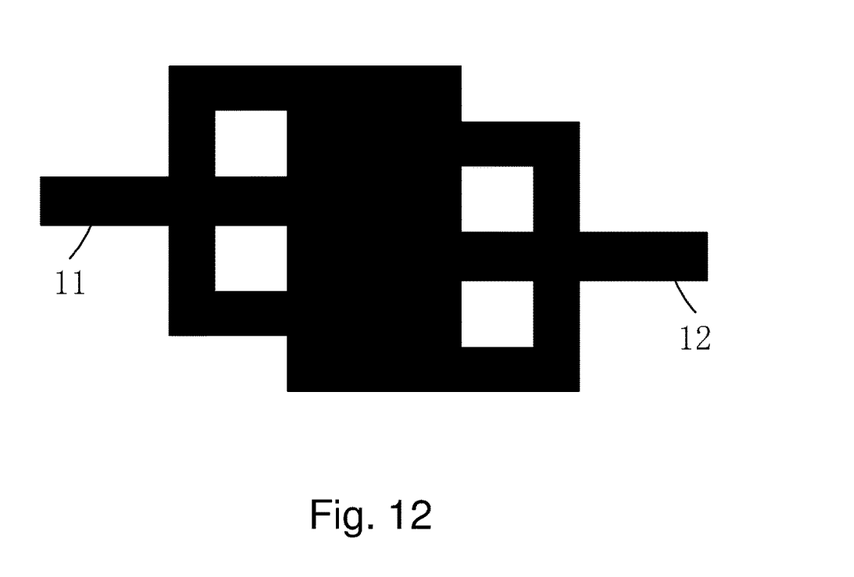
FIG. 12 is a schematic view showing the first metal layer and the second metal layer after ESD in FIG. 11.

Refer to FIGS. 10-12 for the third embodiment of the ESD detection method for array substrate of the present invention. The third embodiment differs from the first embodiment in that: the first metal layer 11 and the second metal layer 12 on the array substrate to be tested are both on the same layer and of a wire stricture, and the remaining is the same as the first embodiment, thus the description will not be repeated.

In summary, the present invention provides an ESD detection method for array substrate. By connecting the first metal layer on the array substrate through the first wire to the first test point, and connecting the second metal layer on the array substrate through the second wire to the second test point, when an ESD occurs on the array substrate, the resistance detection device is used to measure the resistance between the first test point and the second test point. If the resistance is positive infinity, the ESD did not occur between the first metal layer and second metal layer; if the resistance is within a measurable range, an ESD occurs between the first metal layer and the second metal layer. The resistance measured between the first test point and the second test point is used to locate the location of the ESD occurrence on the array substrate. Compared to known method using microscope to search ESD location, the present invention can locate the ESD location on the array substrate more accurately and rapidly to save time and labor as well as detection cost It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An electrostatic discharge (ESD) detection method, which comprises:
    Step 1: providing an array substrate for ESD detection, the array substrate being disposed with a first metal layer and a second metal layer, which are set in a first condition of being spaced and isolated from each other by an insulating layer arranged at a predetermined location of the array substrate; the first metal layer being connected to a first test point on the array substrate through a first wire, and the second metal layer being connected to a second test point on the array substrate through a second wire;
    Step 2: providing a resistance detection device, using the resistance detection device to measure a resistance between the first test point and the second test point;
    wherein an ESD occurring between the first metal layer and the second metal layer causes the first metal layer and the second metal layer to change from the first condition to a second condition in which the first metal layer and the second metal layer extend through the insulating layer to connect with each other at the predetermined location of the array substrate, so that the resistance measured between the first test point and the second test point is within a predetermined range and the ESD occurring at the predetermined location on the array substrate is identified.

2. The ESD detection method as claimed in claim 1, wherein the first metal layer and the second metal layer are on different layers of the array substrate.

3. The ESD detection method as claimed in claim 2, wherein the insulating layer is disposed between the first metal layer and the second metal layer.

4. The ESD detection method as claimed in claim 1, wherein the first metal layer and the second metal layer are on the same layer of the array substrate.

5. The ESD detection method as claimed in claim 1, wherein the array substrate is a low temperature polysilicon (LTPS) thin film transistor (TFT) substrate.

6. The ESD detection method as claimed in claim 1, wherein the first metal layer and the second metal layer are one of Mo, Al or Cu or stacked layers of the above.

7. The ESD detection method as claimed in claim 3, wherein the insulating layer is made of SiNx, SiOx or a combination of both.

8. The ESD detection method as claimed in claim 1, wherein the first wire and the second wire are both metal wires, and the first test point and the second test point are both metal blocks.

9. The ESD detection method as claimed in claim 8, wherein the first wire and the second wire are made of Cu or Al.

10. The ESD detection method as claimed in claim 8, wherein the first test point and the second test point are made of Cu or Al.

11. An electrostatic discharge (ESD) detection method, which comprises:
    Step 1: providing an array substrate for ESD detection, the array substrate being disposed with a first metal layer and a second metal layer, which are set in a first condition of being spaced and isolated from each other by an insulating layer arranged at a predetermined location of the array substrate; the first metal layer being connected to a first test point on the array substrate through a first wire, and the second metal layer being connected to a second test point on the array substrate through a second wire;
    Step 2: providing a resistance detection device, using the resistance detection device to measure a resistance between the first test point and the second test point;
    wherein an ESD occurring between the first metal layer and the second metal layer causes the first metal layer and the second metal layer to change from the first condition to a second condition in which the first metal layer and the second metal layer extend through the insulating layer to connect with each other at the predetermined location of the array substrate, so that the resistance measured between the first test point and the second test point is within a predetermined range and the ESD occurring at the predetermined location on the array substrate is identified;
    wherein the array substrate is a low temperature polysilicon (LTPS) thin film transistor (TFT) substrate;
    wherein the first metal layer and the second metal layer are one of Mo, Al or Cu or stacked layers of the above; and
    wherein the first wire and the second wire are both metal wires, and the first test point and the second test point are both metal blocks.

12. The ESD detection method as claimed in claim 11, wherein the first metal layer and the second metal layer are on different layers of the array substrate.

13. The ESD detection method as claimed in claim 12, wherein the insulating layer is disposed between the first metal layer and the second metal layer.

14. The ESD detection method as claimed in claim 11, wherein the first metal layer and the second metal layer are on the same layer of the array substrate.

15. The ESD detection method as claimed in claim 13, wherein the insulating layer is made of SiNx, SiOx or a combination of both.

16. The ESD detection method as claimed in claim 11, wherein the first wire and the second wire are made of Cu or Al.

17. The ESD detection method as claimed in claim 11, wherein the first test point and the second test point are made of Cu or Al.

\* \* \* \* \*